United States Patent [19]

Gallegos et al.

[11] Patent Number: 5,166,598
[45] Date of Patent: Nov. 24, 1992

[54] MICROWAVE TRANSIENT ANALYZER

[75] Inventors: Cenobio H. Gallegos; James W. Ogle, both of Santa Fe; John L. Stokes, Los Alamos, all of N. Mex.

[73] Assignee: The United States of America as represented by the United States Department of Energy, Washington, D.C.

[21] Appl. No.: 563,380

[22] Filed: Aug. 7, 1990

[51] Int. Cl.$^5$ .......................... G02F 1/28; G01R 23/16
[52] U.S. Cl. ................................ 324/77 K; 324/77 G; 324/77 D; 359/305
[58] Field of Search ............... 350/358; 324/77 K, 96, 324/77 D, 77 G

[56] References Cited

U.S. PATENT DOCUMENTS

| | | | |
|---|---|---|---|
| 3,851,951 | 12/1974 | Eveleth | 350/358 |
| 3,942,109 | 3/1976 | Crumly | 324/77 K |
| 4,117,480 | 8/1978 | Boario | 324/77 K |
| 4,975,635 | 12/1990 | Takahashi | 350/358 |

OTHER PUBLICATIONS

Stokes et al; "High Speed Single Transient Microwave Spectrum Analyzer", Proc. SPIE-Inc. Soc. Opto. Eng.-89 San Diego—.

Primary Examiner—Kenneth A. Wieder
Assistant Examiner—Jose M. Solis
Attorney, Agent, or Firm—Miguel A. Valdes; Roger S. Gaither; William R. Moser

[57] ABSTRACT

A method and apparatus for capturing and recording indications of frequency content of electromagnetic signals and radiation is disclosed including a laser light source (12) and a Bragg cell (14) for deflecting a light beam (22) at a plurality of deflection angles (36) dependent upon frequency content of the signal. A streak camera (26) and a microchannel plate intensifier (28) are used to project Bragg cell (14) output onto either a photographic film (32) or a charge coupled device (CCD) imager (366). Timing markers are provided by a comb generator (50) and a one shot generator (52), the outputs of which are also routed through the streak camera (26) onto the film (32) or the CCD imager (366). Using the inventive method, the full range of the output of the Bragg cell (14) can be recorded as a function of time.

16 Claims, 3 Drawing Sheets

MICROWAVE TRANSIENT ANALYZER

The invention described herein arose in the course of, or under, Contract No. W-7405-ENG-36 between the United States Department of Energy and the University of California for the management and operation of Los Alamos National Laboratory, and Contract No. DE-AC08-88-NV10617 between the United States Department of Energy and E.G. & G. Energy Measurements.

BACKGROUND OF THE INVENTION

The present invention relates to instruments used for analyzing the frequency content of electromagnetic signals, and more particularly to an improvement which can record indications of transient responses resulting from short duration single events in acousto-optic devices. The predominant current usage of the present invention is in the analysis of short pulse duration high bandwidth microwave frequency events, particularly in experiments where it is desirable to produce a record of relative intensities of event power content at various transient frequencies.

The properties of acousto-optic crystals have been previously employed in spectrum analysis devices in several different ways. U.S. Pat. No. 4,633,170 issued to Burns et al. teaches a method for improving the resolution of such a device. A common configuration of an acousto-optic crystal is a Bragg cell. A good general description of Bragg cells and their properties is contained within the Burns patent. In brief, a Bragg cell is a crystalline block with a piezoelectric transducer bonded to its side, such that when the transducer is excited with an electrical signal, a traveling acoustic wave is set up in the crystal. A light beam (almost always a laser beam) is passed through the block from end to end. The acoustic wave created by the electrical signal causes slight changes in the refractive index of the cell material resulting in a portion of the input light beam being deflected. When the Bragg cell is properly tuned, the amplitude of the deflected beam is proportional to the amplitude of the acoustic input, and the deflection angle is proportional to the frequency of the acoustic input. An additional characteristic of the Bragg cell is that the modulation on a signal is preserved. That is, if the input signal contains a number of different frequency components, each component will be deflected according to its frequency (within certain limits, as discussed herein), and the magnitude of each reflected portion will correspond to the relative power of that frequency present in the input signal.

The limiting factors of the usefulness of the Bragg cell in spectrum analysis applications have been mostly due to limitations in the apparatus for receiving and analyzing the diffracted light beams. These limitations have been manifested as limited dynamic range and limited frequency range. Another limitation has been the difficulty of correlating Bragg cell output to temporal changes in transient content over the duration of an event. For example, the most common method for receiving the light beams has been to arrange an array of photosensors, usually photodiodes, such that a the amount of defection of a beam can be ascertained according to which of the array is stimulated, and the magnitude of each deflected portion is then judged to be proportional to the magnitude of the electrical signal resulting from the light incident to each respective photosensor. However, using this method, the dynamic range is limited by the narrow range between the background electrical signal and the saturation point of such photosensors. Further, both the resolution and the range of such an instrument is limited by the number and placement of the photosensors. U.S. Pat. No. 4,722,596, issued to Labrum et al., teaches a method to extend the dynamic range of this type spectrum analyzer by effectively dynamically compressing each portion of the signal at its limit. U.S. Pat. No. 4,636,718, also issued to Labrum et al., teaches a method for extending the frequency range and/or resolution by time sharing the photosensor array among different portions of the frequency spectrum. These methods are very useful for general purpose type spectrum analyzers. However, they still do not provide nearly sufficient frequency range to analyze the entire content of many short duration high energy events. Nor do they allow a sufficiently quick recording time to accurately record such events. Nor do they provide a sufficiently detailed recording of the relative magnitudes of each component frequency to allow a careful and detailed scientific analysis. Of course, prior art methods can make a temporal record giving indications of changes of readings over time by the simple expedient of taking a series of readings as rapidly as the technology will allow. But given the need for time sharing, data recording time, and other factors which slow the process, a great deal of resolution over time is lost by this technique. In fact, changes which occur over extremely short periods of time may be lost entirely from the record.

Therefore, there is clearly a need for a method to allow for the capturing of the output of a Bragg cell which will produce a broad spectrum recording showing all the nuances and fine detail of the Bragg cell deflected light beams and, further, which will create this recording even when an event duration is very brief. Moreover, changes in the Bragg cell output should be recorded continuously, rather than intermittently, in order to preserve an accurate record of such changes over time. To the inventors' knowledge, no prior art method has provided this combination of broad frequency range, acceptable resolution, and quick recording time. Nor has any prior art method provided a means for continuously recording Bragg cell output over the duration of an event.

SUMMARY OF THE INVENTION

Accordingly, it is an object of the present invention to provide an acousto-optic spectrum analyzer with Giga-Hertz wide band width.

It is another object of the present invention to provide a means for measuring relative transient power levels of electromagnetic signals in the microwave spectrum.

It is still another object of the present invention to provide a means for recording relative transient power levels created by events of extremely short duration.

It is yet another object of the present invention to provide a method for taking full advantage of the output frequency range available from commercially available Bragg cells.

It is yet another object of the present invention to provide a method for recording the output of a Bragg cell continuously over the duration of an event, as opposed to recording the output as a series of readings taken over time.

Briefly, the preferred embodiment of the present invention is a Bragg cell spectrum analyzer employing a conventional high frequency Bragg cell and conventional laser and laser focusing apparatus. The unique aspect of the present invention lies in the means for capturing and recording indications of light diffracted within the Bragg cell. Rather than using the conventional means for converting the Bragg cell output to an electrical signal and thus providing an output signal for electronic analysis and recording, the Bragg cell output is recorded directly either on film or on a CCD video imaging apparatus or the like. The characteristics of the Bragg cell and the several phenomenon involved have previously caused this sort of approach to a solution to the several problems involved to be considered impractical. However, as explained herein, the inventive method provides solutions to the several problems and makes the method quite practical for the intended applications. In fact, the inventive method is the only known solution to the need for a very wide band width and wide dynamic range spectrum analysis recording device, particularly if the event to be recorded is of short duration and if there is a need for an accurate record of reasonably precise resolution.

In order to accomplish these purposes, the inventors have combined formerly uncombined technologies in a way previously thought to be impractical. A primary problem faced by one attempting to record the output of a Bragg cell (or similar device) in a very short period of time is that the time that is taken by the Bragg cell to set up a standing wave, and thus to correctly diffract light, is a significant portion of the duration of the event. Therefore, the indications of an event may, in a sense, be smeared across the detector means. For longer duration events (roughly, those over 1 $\mu S$) which result in a pulse longer than the optic window of the Bragg cell, a sampling can be taken during that portion of the event wherein the characteristics of the Bragg cell are not changing. The inventors have found that, contrary to conventional wisdom, an analysis of a filmed recording of events which result in a pulse shorter than the optic window of the Bragg cell produces a very revealing and scientifically useful result, as is discussed herein.

A first preferred embodiment of the invention utilizes a photographic film as a photosensitive recording medium. A second equally preferred embodiment utilizes a CCD imager and corresponding video electronics as a recording medium. Both embodiments produce a visually readable record of the output of a Bragg cell essentially in the form of a graph showing instantaneous Bragg cell output in relation to time.

An advantage of the present invention is that indications of the relative frequency content of electromagnetic signals of very short duration can be recorded for study.

Another advantage of the present invention is that an extremely wide frequency bandwidth can be recorded.

A further advantage of the present invention is that a wide range of relative power intensities can be recorded for study.

Yet another advantage of the present invention is that the full range of wide bandwidth Bragg cells can be utilized.

Still another advantage of the present invention is that complex time sharing and/or dynamic compression circuits are not required.

Still another advantage of the present invention is that a continuous record over the duration of an event is made, and thus a record is made of even very rapidly occurring changes in signal frequency content.

These and other objects and advantages of the present invention will become clear to those skilled in the art in view of the description of the best presently known mode of carrying out the invention and the industrial applicability of the preferred embodiment as described herein and as illustrated in the several figures of the drawing.

DETAILED DESCRIPTION OF THE INVENTION

The best presently known mode for carrying out the invention is a microwave transient analyzer incorporating a Bragg cell and conventional laser and optical components on the input side of the Bragg cell. The combination of these components with the recording portion of the analyzer is unique to the present invention. The predominant expected usage of the inventive method for recording the indications of transient signal content of a sample signal is for the analysis of sample signals produced by events which may occur over a very short duration but which also can produce a broad spectrum of electromagnetic energies, particularly in the recording of indications resulting from single unique events such as may occur in high energy research work.

Figure 1:
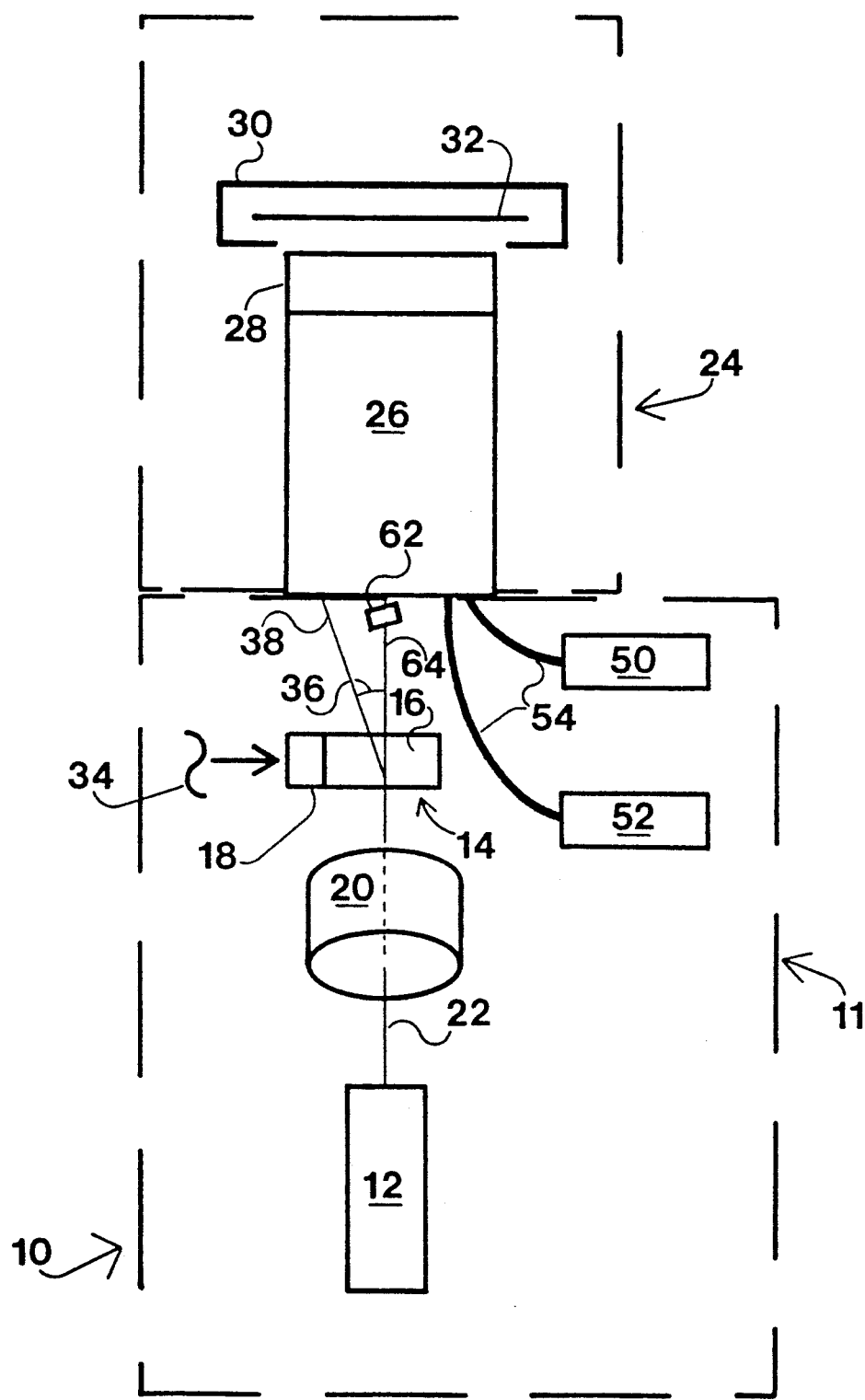
FIG. 1 is a block schematic diagram of a microwave transient analyzer according to the first presently preferred embodiment of the present invention.

The microwave transient analyzer of the first presently preferred embodiment of the present invention is illustrated in block schematic diagram form in FIG. 1 and is designated therein by the general reference character 10. In many of its substantial components, the transient analyzer 10 does not differ significantly from some conventional transient analyzer systems.

The conventional element of the analyzer 10 is a Bragg cell light deflection portion 11 having a laser light source 12 and a Bragg cell 14. The Bragg cell 14 has as its primary components an acousto-optic crystal 16 and a transducer 18 affixed to the side of the crystal 14. The acousto-optic crystal 16 is a well known piece of crystalline material having the property of combining interference and diffraction effects to scatter light passed there through at an angle which depends on the ratio of the wavelengths of light and sound waves coexisting in the medium. In the first presently preferred embodiment of the invention, a HeNe laser is used as the laser light source 12, but the scope of the present invention is not limited by the particular type of laser light source 12 employed. Nor is the choice of a Bragg cell 14 a limitation on the scope of the present invention, as the inventive principles apply equally with an application of any configuration of similar acousto-optic crystal device. The analyzer 10 further includes conventional collimating optics 20 for directing a light beam 22 from the light source 12 onto the Bragg cell 14.

In accordance with the inventive method, a photographic image recorder section 24 is utilized instead of an opto-electric image capturing array (not shown) such as is found in more conventional units. The image recorder section 24 of the best presently known embodiment 10 of the present invention includes a streak camera 26, a microchannel plate intensifier 28 and a film cartridge 30 containing a photographic film 32. The film 32 and film cartridge 30 are rigidly affixed within the image recorder 24 to prevent movement of the film 32 during operation of the analyzer 10. In operation, a light beam 22 is emitted from the light source 12 and focused on the Bragg cell 14 by the collimating optics 16. After being focused by the collimating optics 16, the light beam 22 is of about 0.4 mm in diameter. A sample signal 34 is introduced to the transducer 18 which results in a physical vibration being introduced into the crystal 16 which propagates through the crystal at, essentially, the speed of sound as fixed by the properties of the crystal 16. Accordingly, the Bragg cell 14 deflects portions of the light beam 22 by a deflection angle 36 dependent upon frequency content of the sample signal 34. It should be noted that, in FIG. 1, a single deflection angle 36 is shown for purposes of example only. In practice, a sample signal 34 might well have a complex frequency content, and thus a plurality of deflection angles 36 could exist simultaneously, such that different portions of the light beam 22 would be deflected at the plurality of deflection angles 36 with the relative intensity of light at each such deflection angle 36 being proportional to the power of the corresponding frequency content of the sample signal 34. It should be noted that a limitation on the number of different frequencies which can be simultaneously detected by the Bragg cell 14 is limited by the maximum total power handling capability of the Bragg cell 14 (approximately 1 watt continuous or somewhat greater than 1 watt pulsed) and the threshold of detection of the Bragg cell (which will be discussed in greater detail in the industrial applicability section herein). In brief, only those frequencies which exist at a power level above such a threshold of detection will result in a deflection of the light beam 22 by the Bragg cell 14. It should further be noted that the threshold of detection is also frequency dependent.

For a sample signal 34 having its entire power content existing at only a single frequency, a single deflected portion 38 of light will be diverted by the Bragg cell while, for a complex sample signal 34 containing several frequencies, the Bragg cell 14 might spread the light beam 22 thus creating as many deflected portions 38 as there are independent frequencies existing above the power threshold of detection, with each of the separate deflected portions 38 being of an intensity proportionate to the power content of the component of the sample signal 34 existing at the corresponding frequency. Therefore, as can be appreciated by one skilled in the art, the light beam may reach the streak camera 26 at any given instant as a single spot 40 (FIG. 2) of light, or as a spot row 41. As a practical matter, the single spots 40 and spot rows 41 may or may not be as distinct as those pictured depending, of course, on how well the Bragg cell is able to distinguish the relevant frequency from any immediately surrounding frequencies. In practice, however, the inventors have found that the transient analyzer 10 according to the present invention has produced very distinct recordings, as will be discussed in more detail hereinafter.

Figure 2:
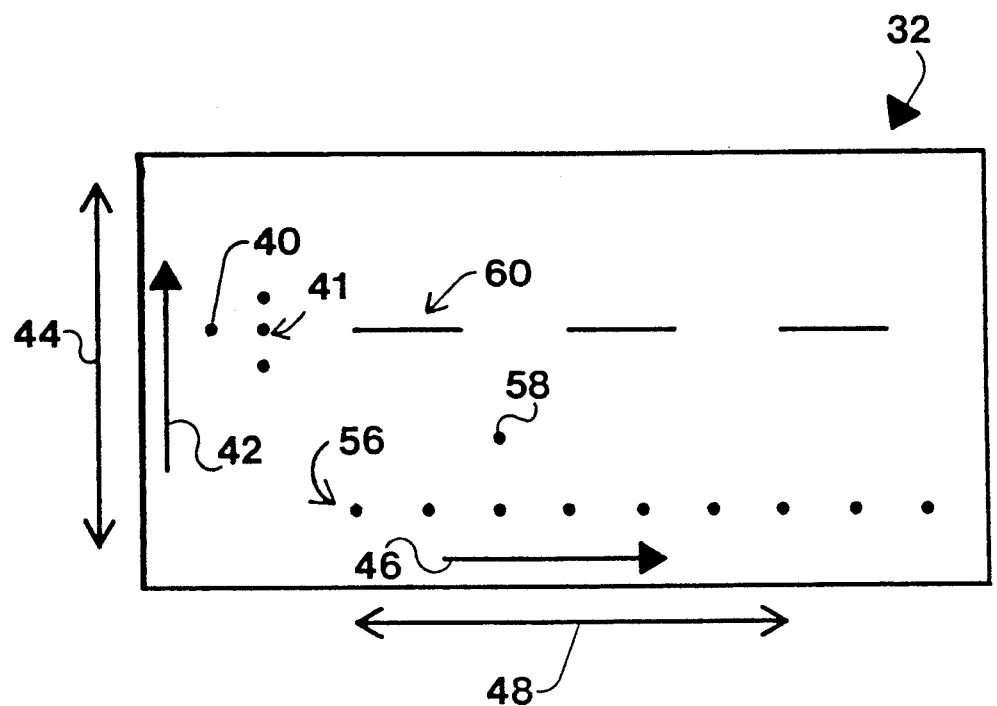
FIG. 2 is an illustration representing an exposed film showing traces produced by operation of the transient analyzer.

The streak camera 26 is set up to scan an image of the light beam 22, as required, across the film 32 at right angles to the direction of deflection caused by the Bragg cell 14. Referring now to FIG. 2, which depicts the film 32 as seen from the perspective of the streak camera 26, a Bragg cell deflection direction 42 is along a Y axis 44 of the film and a streak camera scanning direction 48 is along an X axis 48 of the film 32.

The streak camera 26 (FIG. 1) is a well known device which is capable of scanning an image across a piece of film 32 at an adjustable rate such that the equivalent of a time based graph of the image is produced. For those unfamiliar with the streak camera 26 it is best understood as being essentially the photographic equivalent of an oscilloscope in that a representation of variable data will be produced on the Y axis 44 of the film 32, while the X axis 48 on the film 32 shows how the Y axis 44 data changes over time. The microchannel plate intensifier 28, likewise, is a commonly available piece of equipment which is here being used to intensify the output of the streak camera 26.

The transient analyzer of the first presently preferred embodiment 10 of the present invention further includes a comb generator 50 and a one shot generator 52. The comb generator 50 produces a series of light pulses at an adjustable regular time interval, while the one shot generator 52 produces a single light pulse when directed by external timing circuitry (not shown) which external timing circuitry is also controlling the timing of the experiment the results of which the transient analyzer 10 is to record. Light from the comb generator 50 and the one shot generator 52 is carried to and projected on the streak camera 26 via optic fibers 54.

Referring again to FIG. 2, the results of an operation of the transient analyzer 10 can be seen. As can be appreciated from the previous discussion, the single spot 40 is a recording of a deflection of the deflected portion 38 of the light beam 22 (FIG. 1) as might be produced by the Bragg cell 14 when the sample signal 34 contains but a single frequency existing above the power threshold of detection. The spot row 41 is a recording of a deflection spectrum of the light beam 22 as might be produced by the Bragg cell 14 when the sample signal 34 contains three distinct frequencies such that the light beam 22 is divided and diverted at three distinct deflection angles 36 (FIG. 1). Of course, both the single spot 40 and the spot row 41, as shown, represent images such as might be made if the streak camera 26 was not scanning while the film 32 was being exposed. It should be noted that, for purposes of the drawing, the film 32 of FIG. 2 is shown as a positive image (black traces on a white background) while, in actual practice, a negative image is first produced on the film 32. The inventors have found that either negative or positive images can be used equally successfully for analysis purposes.

Now beginning a description of the operation of the transient analyzer 10, during the time period when the streak camera 26 is scanning the film 32, the comb generator will produce a plurality of evenly spaced timing traces 56. Upon command, the one shot generator 50 will produce a single fiducial trace 58. While the timing traces 56 allow for a measurement of elapsed time, the single fiducial trace 58 provides a timing reference to correlate results to the timing of the event being analyzed. The example here shows a data trace 60 such as would be made with a sample signal 34 (FIG. 1) of a single frequency, and being pulsed at regular intervals. One skilled in the art should now appreciate, from the examples of FIG. 2, the nature of the general appearance of the traces 56, 58 and 60 as produced on the film 32 of the presently preferred embodiment 10 of the present invention. A range of scalar units applicable to the X and Y axis 48 and 44 of the example of FIG. 2 will be discussed hereinafter particularly in relation to the industrial applicability of the present invention.

Referring again to FIG. 1, the preferred embodiment 10 of the invention, includes a light block/attenuator 62 positioned so as to intercept any undeflected portion 64 of the light beam 22. As presently practiced, the attenuator 62 is used to block the undeflected portion 64 entirely. Since the undeflected portion 64 will usually be considerably more intense than the deflected portion 38, it is desirable to block the undeflected portion 64 in order to prevent it from overexposing the film 32 or otherwise degrading the definition of the traces 56, 58 and 60 (FIG. 2). However, the inventors believe that an attenuator 62 which reduces the intensity of the undeflected portion 64 by a known proportion (rather than blocking it entirely) would be a useful modification in some applications, since a comparison trace (not shown) created thereby would provide a useful comparison standard as to the intensity (and perhaps also the position) of the data trace(s) 60.

Figure 3:
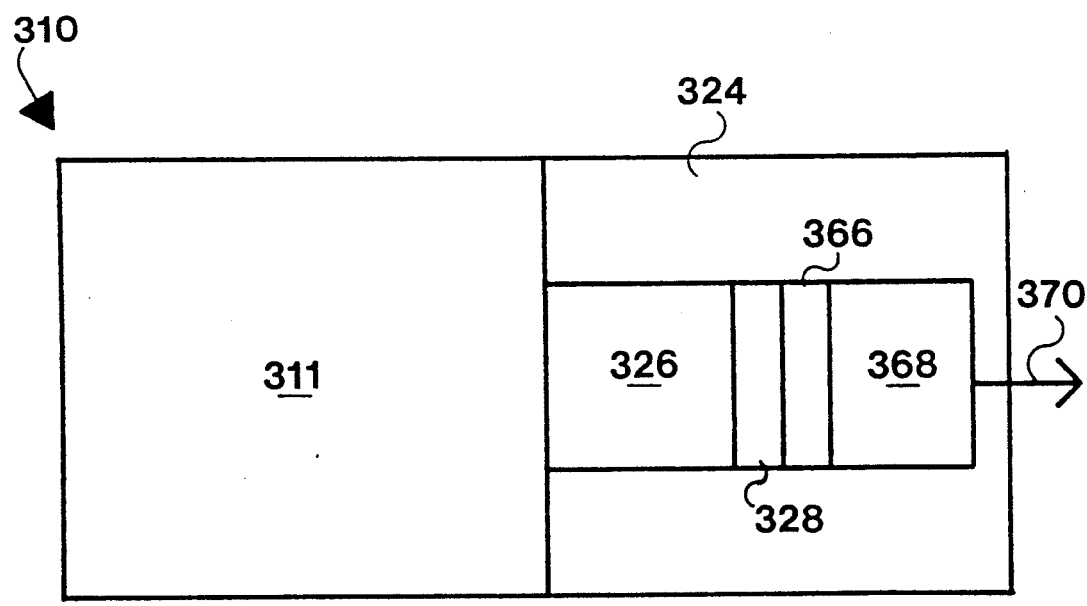
FIG. 3 is a block schematic diagram of a transient analyzer according to an alternate equally preferred embodiment of the present invention.

An equally preferred alternate embodiment of the invention is shown in FIG. 3 and is designated therein by the general reference character 310. The analyzer 310 has a Bragg cell light deflection portion 311 like the Bragg cell light deflection portion 11 of the first preferred embodiment 10 of the invention. The alternate embodiment 310 of the invention differs from the first preferred embodiment 10 in that the alternate embodiment 10 incorporates a CCD image recorder 324 instead of the photographic image recorder 24. A streak camera 326 and a microchannel plate intensifier 328 are employed in the CCD image recorder 324 in the same capacities as are the streak camera 26 and the image intensifier 28 of the photographic image recorder 24 of the first preferred embodiment 10 of the invention. The CCD image recorder 324 has a CCD imager 366 instead of the film 32 and film cartridge 30 of the first preferred embodiment 10 of the invention. The CCD imager 366 captures any image projected by the streak camera 326 in the same manner as does any conventional CCD imager, and is controlled by conventional video camera circuitry. It should be noted that, since the analyzer 310 is intended to record information obtained from events of only a very short duration, the CCD imager 366 and video camera circuitry 368 should both be of a type capable of recording at very high speed. A video output signal cable 370 provides an output means for the analyzer 310. Of course, the alternate preferred embodiment 310 of the invention may not be capable of the image resolution which the first preferred embodiment 10 provides. However, the alternate preferred embodiment provides the additional advantages of enabling a user to immediately view results, and to store images directly to computer or video tape. This last advantage provides some of the ease of use of prior art opto-electric Bragg cell data retrieval methods while still retaining unique and very important aspects of the present invention such as the continuous recording of traces and the continuous comparative power versus frequency analysis capabilities of the invention.

As is shown above, in great part, the microwave transient analyzers 10 and 310 of the present invention resemble prior art conventional opto-acoustic transient analyzers, which have used laser light modulation to analyze signal frequency content, in many respects. The substantial difference exists in the inclusion of the photographic image recorder section 24 or the equivalent CCD image recorder section 324 for implementing the inventive method for capturing and recording the output of the Bragg cell 14. A related difference exists in the differences between the frequency bandwidth and recording timing made possible by the inventive method. No materials used are significantly unique nor are any special constructions required.

Various modifications may be made to the invention without altering its value or scope. For example, while the best presently known mode of the invention has been described herein in terms of a Giga-Hertz band width device, the inventive method is applicable to any frequency range for which appropriate Bragg cells 14 can be obtained. Indeed, one of the values of the present invention derives from the fact that the entire range of outputs of any Bragg cell 14 can be recorded. Another obvious modification would be to use a different type of light source and/or different type optics. Indeed, the inventors have theorized that additional optics might be placed between the Bragg cell 14 and the streak camera 26 to further enhance the resolution of the device. Another modification envisioned by the inventors is to place an additional optic fiber 54 to also carry output from the comb generator 50 such that a second set (not shown) of timing traces 56 could be placed above the data trace 60 on the film 32 to increase timing measurement accuracy and ease of interpretation. Also, while the best presently known embodiment 10 and the equally preferred alternate embodiment 310 of the invention have been described herein as generally using a "light" beam 22 emitted from a laser light source 12, the term "light" is not herein intended to limit the application of the invention to use only with lasers emitting energy in the visual wavelength spectrum. Certainly, the invention is equally adaptable for use with laser beams outside the visible spectrum with corresponding changes in the sensitivity range of the film 32 or the CCD imager 336.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

While the transient analysis method of the present invention is adaptable for use in many applications in which prior art Bragg cell analyzers might be employed, and thus there is certainly some overlap of useful applications for prior art devices and the present invention, the significant departures from prior art methods described herein are particularly adapted to be most useful in certain specialized circumstances. An appreciation of the measurement range and limitations of the present inventive method is key to understanding its industrial applicability. Indeed, until the inventors began to discover this information, they had assumed that the limitations of the method must be much greater than they actually are. It is thought that, perhaps, solutions such as the present inventive method have been overlooked as a means for recording Bragg cell output primarily because of prevailing assumptions concerning these limitations.

Figure 4:
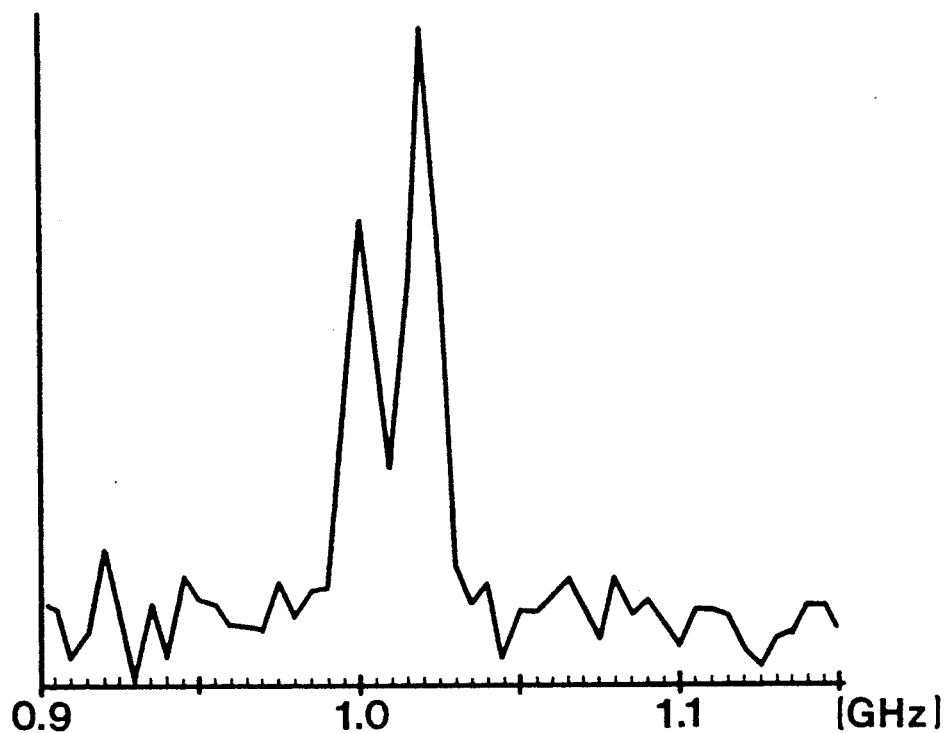
FIG. 4 is an exemplary graph of data taken using the inventive method, showing frequency response.

The predominant current usages are for research applications wherein it is necessary to carefully study the timing of the existence of relative frequencies within an electromagnetic radiation, and further wherein such frequencies may exist over a wide frequency band. Additionally, such frequencies may exist at a wide dynamic range of power levels. To date, the inventors have measured frequencies in a range from 350 MHz to 2000 MHz using the inventive method. Pulse widths as narrow as 10 ns have been measured. These figures are certainly not limitations of the capabilities of the inventive method. Rather they are given here as being indicative of the range of usefulness which the inventors have discovered to be unique to the present invention. For the benefit of those skilled in the art, FIG. 4 is an example of reduced data taken when a pulse having a frequency of 1 GHz was recorded and then a pulse having a frequency of 1.02 GHz was recorded on the same film. The pulses used in this experiment were longer than the optical window of the Bragg cell 14 used, which was 1.0 μS. The resolution shown will, of course, degrade when measuring a pulse shorter than the optical window. It should be noted that data contained in FIG. 4 is, in many respects, much more useful than can be obtained by any prior art method since any characteristics of the phenomenon involved can be studied in detail. The two indications of the test frequencies used are, in fact, remarkably distinct. Note that Y axis data of FIG. 4 is not marked in units, as it is intended to be only an indication of the relative density of an image on the film 32 (which, of course, is an indication of the relative power levels at which corresponding frequencies exist). In order to convert these arbitrary units into interpretations of real power levels, it would be necessary to include a comparison standard, as is discussed previously herein. Further, factors such as the linearity of response of the film used in the appropriate range must be considered. Well known principles of photography can be applied to choose an appropriate film and to analyze the data obtained therefrom.

Figure 5:
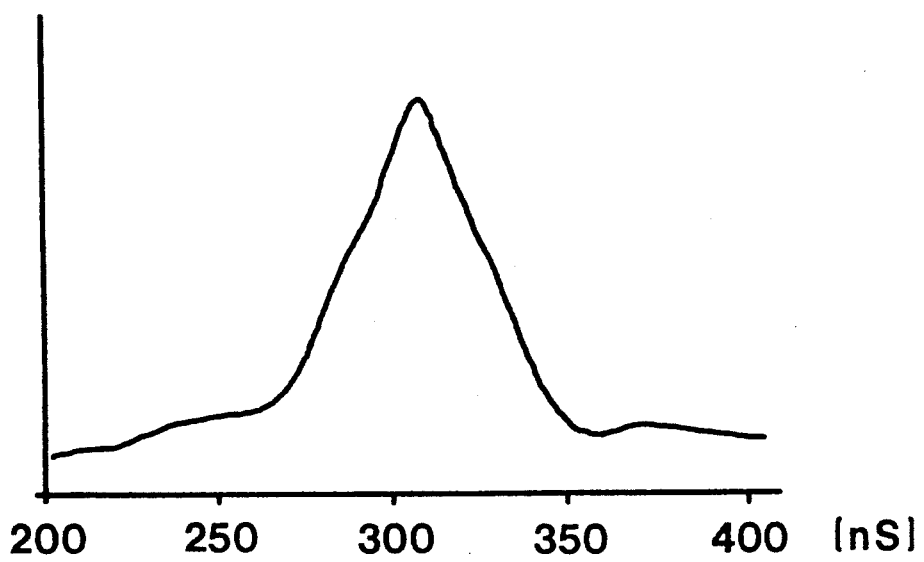
FIG. 5 is an exemplary graph of data taken using the inventive method, showing temporal response.

Regarding the optical window and other aspects of the temporal response of the inventive transient analyzer, FIG. 5 is a graph of the results obtained from using a sample signal 34 (FIG. 1) produced by adding the constant wave signal of a sweep generator to a square pulse from a pulse generator through a microwave mixer. The resulting sample signal 34 (FIG. 1) was a square pulse of microwaves having the constant wave output existing as a background level at a proportion of ¼ the power of the pulse portion of the signal. FIG. 5 shows the analysis of a 23 nS wide pulse at 10 mW input power to the Bragg cell 14. For the equipment used in this experiment, the expected time to for a resultant image was about 63 nS because the beam size was 0.4 mm diameter and the acoustical velocity within the Bragg cell 14 was 6.3 km/S. The inventors have found that pulses less than 10 nS wide can be observed using the inventive method, but amplitudes of such pulses, as recorded, are much lower. Thus, the power level threshold of detection of such short duration events will be dependent upon the duration of such events. In FIG. 5, also, the Y axis data is in arbitrary units, as is discussed in detail above. While the inventors have not discovered the limits of dynamic range of data which the inventive method can record, they have ascertained that the range is much greater than 20 dB.

Since the invention provides a type and arrangement of data necessary for scientific analysis of certain electromagnetic radiation, which sort of analysis has heretofore not been possible using any prior art method, and since the transient analyzers of the present invention may be readily constructed, and are physically significantly similar to prior art conventional devices, it is expected that they will be acceptable in the industry as substitutes for the conventional transient analyzers in some applications, and as enhancements to conventional analyzers in many applications wherein the conventional analyzers are not capable of obtaining the sort of data required. For these and other reasons, it is expected that the utility and industrial applicability of the invention will be both significant in scope and long-lasting in duration.

We claim:

1. A transient analyzer for producing an indication of a frequency content of a sample signal, including:
   a. a laser source for producing a coherent beam;
   b. an acousto-optic crystal for deflecting the coherent beam at a plurality of angles corresponding to the frequency content of an acoustic disturbance within said crystal;
   c. a focusing means for directing said coherent beam onto said crystal;
   d. a transducer contiguous with said crystal for transforming the sample signal into said acoustic disturbance;
   e. recording means for producing a visually discernible recording of one or more deflected beams, each said deflected beam being a component of said coherent beam, as deflected by the crystal; and
   f. a scanning means for scanning said deflected beam across said recording means thereby creating a record of changes in position and intensity of said deflected beams over time;
   wherein said deflected beams are deflected at an angle corresponding to the frequency of the corresponding portion of said sample signal, with the intensity of said deflected beams being proportional to the relative power content of said sample signal which is present at the frequency of the corresponding portion of said sample signal.

2. The analyzer of claim 1, wherein:
   the recording means includes a photographic film.

3. The analyzer of claim 1, wherein:
   the recording means includes a charge coupled device imager and associated imaging circuitry.

4. A method for analyzing the frequency content of a signal, in steps including:
   a. projecting a beam onto an acousto-optic cell, said acousto-optic cell having the property of altering a refractive index of an acousto-optic crystal according to a frequency of vibration of said crystal;
   b. vibrating said crystal by way of a transducer attached thereto, said transducer being driven by a sample signal;
   c. recording a visual record of a plurality of positions and intensities of said beam after said beam exits said acousto-optic cell;
   wherein said visual record is made by directing said beam onto a photosensitive medium; and
   simultaneously, while making said visual recording, further directing said beam such that said beam scans across said photosensitive medium in a direction perpendicular to changes of the position of said beam caused by said alteration of the refractive index of said acousto-optic crystal.

5. The analyzer of claim 1, wherein:
said scanning means is a streak camera.

6. The analyzer of claim 5, and further including:
a microchannel image intensifier placed between said streak camera and said recording means for intensifying the output of said streak camera.

7. In a acousto-optic transient analyzer including a laser light source and an acousto-optic cell for deflecting a beam by a deflection angle corresponding to a sample signal frequency content, the improvement comprising:
a visual image recording section for producing a visual representation of a plurality of positions to which the beam is deflected and also for showing a relative intensity of the deflected beam at each of said positions, said visual image recording section including a photosensitive detector means and a projection means for projecting the beam, as deflected by the acousto-optic cell, onto said photosensitive detector means;
wherein said projection means includes a streak camera for further deflecting the beam across said photosensitive detector means in a direction perpendicular to said deflection angle.

8. The method of claim 4, wherein:
the acousto-optic cell is a Bragg cell having a frequency response in the Giga-Hertz range.

9. The improvement of claim 7, wherein:
said photosensitive detector means includes a photographic film.

10. The improvement of claim 7, wherein:
said photosensitive detector means includes a charge coupled device imager.

11. The improvement of claim 7, and further including:
a comb generator for producing a light pulse at regular time intervals, said light pulse being projected through said streak camera along with said beam such that said light pulse provides an indication of elapsed time.

12. The improvement of claim 7, and further including:
a one shot generator for producing a single light pulse at a known time, thus providing a fiducial time reference for any changes in intensity or position of said beam.

13. The method of claim 4, wherein:
said beam is scanned across said photosensitive medium using a streak camera.

14. The method of claim 13, and further including:
simultaneously, while making said visual recording, projecting a series of light pulses through said streak cameras at regularly spaced time intervals, such that a series of dots is produced on said visual record.

15. The method of claim 13, and further including:
simultaneously, while making said visual record, projecting a single light pulse through said streak camera at a known time, such that a single pulse is produced on said visual recording as a time reference.

16. The method of claim 13, wherein:
said visual record is embodied in an electronic video signal which can be recorded using a video recorder and which can be further viewed using a video viewing apparatus.

* * * * *